US008784699B2

(12) United States Patent
Yano et al.

(10) Patent No.: US 8,784,699 B2

(45) **Date of Patent: *Jul. 22, 2014**

(54) IN-GA-ZN-TYPE OXIDE, OXIDE SINTERED BODY, AND SPUTTERING TARGET

(75) Inventors: Koki Yano, Chiba (JP); Masayuki Itose, Chiba (JP); Hirokazu Kawashima, Chiba (JP)

(73) Assignee: Idemitsu Kosan Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/257,683

(22) PCT Filed: Nov. 17, 2010

(86) PCT No.: PCT/JP2010/006746

§ 371 (c)(1), (2), (4) Date: Sep. 20, 2011

(87) PCT Pub. No.: WO2011/061930

PCT Pub. Date: May 26, 2011

(65) Prior Publication Data

US 2012/0216710 A1 Aug. 30, 2012

(30) Foreign Application Priority Data

Nov. 19, 2009 (JP) ................................ 2009-264084

(51) Int. Cl.

| | |
|---|---|
| ***C09D 1/00*** | (2006.01) |
| ***H01B 1/02*** | (2006.01) |
| ***C23C 14/00*** | (2006.01) |
| ***B32B 15/00*** | (2006.01) |
| ***H01L 29/10*** | (2006.01) |
| ***H01L 29/06*** | (2006.01) |
| ***H01L 29/12*** | (2006.01) |
| ***H01L 21/00*** | (2006.01) |
| ***H01L 21/16*** | (2006.01) |
| ***C01G 15/00*** | (2006.01) |
| ***C04B 35/626*** | (2006.01) |
| ***C23C 14/08*** | (2006.01) |
| ***H01L 29/786*** | (2006.01) |
| ***C04B 35/453*** | (2006.01) |
| ***C01G 9/02*** | (2006.01) |
| ***C23C 14/34*** | (2006.01) |
| ***H01L 29/66*** | (2006.01) |
| *H01L 21/02* | (2006.01) |

(52) U.S. Cl.

CPC ........... *C04B 35/453* (2013.01); *C01P 2002/72* (2013.01); *C01G 15/006* (2013.01); *C01G 15/00* (2013.01); *C04B 35/62675* (2013.01); *C23C 14/08* (2013.01); *H01L 21/02554* (2013.01); *C04B 2235/664* (2013.01); *C04B 2235/3284* (2013.01); *H01L 29/7869* (2013.01); *C04B 2235/3286* (2013.01); *C04B 2235/5409* (2013.01); *C04B 2235/666* (2013.01); *C01G 9/02* (2013.01); *C04B 2235/77* (2013.01); *H01L 21/02631* (2013.01); *C23C 14/3414* (2013.01); *C04B 2235/6565* (2013.01); *H01L 21/02565* (2013.01); *H01L 29/66742* (2013.01); *C04B 2235/6585* (2013.01); *C04B 2235/6567* (2013.01); *C04B 2235/658* (2013.01); *C04B 2235/6562* (2013.01); *C04B 2235/80* (2013.01); *C04B 2235/963* (2013.01)

USPC .................. 252/518.1; 106/286.2; 204/192.1; 428/432; 257/43; 257/E29.079; 257/E21.328; 257/E21.459; 438/796; 438/104

(58) Field of Classification Search

None

See application file for complete search history.

(56) References Cited

U.S. PATENT DOCUMENTS

| | | | | |
|---|---|---|---|---|
| 5,843,341 | A | 12/1998 | Orita et al. | |
| 5,955,178 | A | 9/1999 | Orita et al. | |
| 5,972,527 | A | 10/1999 | Kaijou et al. | |
| 8,334,532 | B2 * | 12/2012 | Umeda et al. | 257/43 |
| 8,343,800 | B2 * | 1/2013 | Umeda et al. | 438/104 |
| 2007/0252147 | A1 | 11/2007 | Kim et al. | |
| 2009/0189153 | A1 | 7/2009 | Iwasaki et al. | |
| 2010/0108502 | A1 | 5/2010 | Inoue et al. | |
| 2010/0289020 | A1 | 11/2010 | Yano et al. | |

| | | | | |
|---|---|---|---|---|
| 2011/0101342 | A1 | 5/2011 | Kim et al. | |
| 2011/0101343 | A1 | 5/2011 | Kim et al. | |
| 2012/0093712 | A1 * | 4/2012 | Yano et al. | 423/594.14 |

FOREIGN PATENT DOCUMENTS

| | | | |
|---|---|---|---|
| EP | 2096188 | A1 * | 9/2009 |
| JP | 63-239117 | A | 10/1988 |
| JP | 6-234565 | A | 8/1994 |
| JP | 8-245220 | A | 9/1996 |
| JP | 2007-73312 | A | 3/2007 |
| JP | 2007-281409 | A | 10/2007 |
| JP | 2009-533884 | A | 9/2009 |
| JP | 4415062 | B1 | 11/2009 |
| JP | 4571221 | B1 | 8/2010 |
| WO | WO 2008/072486 | A1 | 6/2008 |
| WO | WO 2009/075281 | A1 | 6/2009 |
| WO | WO 2009/084537 | A1 | 7/2009 |

OTHER PUBLICATIONS

International Search Report of PCT/JP2010/006746 (Feb. 8, 2011).

Partial Translation of the Written Opinion of the International Searching Authority.

M. Nakamura et al., "The Phase Relations in the In2O3-Ga2ZnO4-ZnO System at 1350C", Journal of Solid State Chemistry, vol. 93, No. 2 (1991) pp. 298-315.

T. Moriga et al., "Electrical and Optical Properties of Transparent Conducting Homologous Compounds in the Indium-Gallium-Zinc Oxide System", Journal of the American Ceramic Society, vol. 82, No. 10 (1999) pp. 2705-2710.

* cited by examiner

*Primary Examiner* — Guinever Gregorio

(74) *Attorney, Agent, or Firm* — Millen, White, Zelano & Branigan, P.C.

(57) ABSTRACT

An oxide including indium (In), gallium (Ga) and zinc (Zn), wherein diffraction peaks are observed at positions corresponding to incident angles (2θ) of 7.0° to 8.4°, 30.6° to 32.0°, 33.8° to 35.8°, 53.5° to 56.5° and 56.5° to 59.5° in an X-ray diffraction measurement (CuKα rays), and one of diffraction peaks observed at positions corresponding to incident angles (2θ) of 30.6° to 32.0° and 33.8° to 35.8° is a main peak and the other is a sub peak.

11 Claims, 8 Drawing Sheets

IN-GA-ZN-TYPE OXIDE, OXIDE SINTERED BODY, AND SPUTTERING TARGET

TECHNICAL FIELD

The invention relates to a novel In—Ga—Zn-based oxide. In particular, the invention relates to an oxide suitable as an oxide semiconductor, a transparent conductive film or the like, and an oxide sintered body and a sputtering target using the same.

BACKGROUND ART

An amorphous oxide film formed of indium oxide and zinc oxide, or indium oxide, zinc oxide and gallium oxide has attracted attention as a transparent conductive film or a semiconductor film (for example, one used in a thin film transistor or the like) due to visible light transmittance and a wide range of electric properties ranging from a conductor or a semiconductor to an insulator.

As the method for forming a film of the above-mentioned oxide, a physical film-forming method such as sputtering, PLD (pulse laser deposition) and vapor deposition and a chemical film-forming method such as a sol-gel method have been studied. Of these methods, a physical film-forming method such as sputtering has mainly been studied since a film can be formed uniformly in a large area at relatively low temperatures.

When an oxide thin film is formed by the above-mentioned physical film-forming method, it is common to use a target composed of an oxide sintered body in order to form a uniform film stably and efficiently (at a high film-forming speed).

As the target for forming the above-mentioned oxide film (mainly, a sputtering target), studies have been mainly made on one having a composition of a known crystal form such as $In_2O_3(ZnO)_m$ (m=2 to 20), $InGaZnO_4$ and $In_2Ga_2ZnO_7$ or one having a composition close to that of these crystal forms.

Specifically, a target which is formed of a sintered body of an oxide which comprises mainly In and Zn and contains a hexagonal compound represented by the general formula $In_2O_3(ZnO)_m$ (m=2 to 20) or a target obtained by doping this oxide with at least one kind of an element having a valency of positive trivalency or higher in an amount of 20 at. % or less is disclosed (Patent Document 1).

Further, a target having a crystal structure of a hexagonal compound such as $InGaZnO_4$ and $In_2Ga_2ZnO_7$ (homologous structure) has been studied (Patent Documents 2, 3 and 4).

Further, studies have been made on development of a target utilizing the properties of a mixture. For example, development of a target formed of a mixture of a hexagonal compound represented by $In_2O_3(ZnO)_m$ (m=2 to 20) and $In_2O_3$ or a target formed of a mixture of a hexagonal compound represented by $In_2O_3(ZnO)_m$ (m=2 to 20) and ZnO (Patent Document 1), a target formed of a mixture of a hexagonal compound represented by $InGaZnO_4$ and a spinel compound represented by $ZnGa_2O_4$ (Patent Document 5) or the like has been studies.

In addition, Patent Document 6 discloses an oxide represented by $InGaO_3(ZnO)m$ (m=1 to 20) such as $InGaO_3(ZnO)_2$ and a synthesis method thereof.

As for targets, no studies have been made on other oxides than those having the above-mentioned known crystal form, and various thin films obtained by changing the composition ratio have been only studied. Specifically, a thin film formed by a method in which the composition ratio is adjusted during the film formation by co-sputtering or the like has been studied (Patent Documents 2 and 7).

Regarding sputtering targets containing indium oxide, zinc oxide and gallium oxide, as for targets formed of oxides having substantially a single crystal structure, studies have been made only on targets formed of $InGaZnO_4$ and $In_2Ga_2ZnO_7$. No studies have been made on sputtering targets having other crystal forms as substantially a single component or the production of a thin film transistor using it.

Meanwhile, as for oxides which do not have known crystal forms, a change in solubility limit or lattice constant of a sintered body obtained by firing powder raw materials has been reported (Non-Patent Documents 1 and 2). Non-Patent Document 2 gives an example in which calculation is made on the assumption that an oxide having a crystal form represented by $In_{1.5}Ga_{0.5}O_3(ZnO)_m$ is present. However, no specific studies such as the synthesis of this oxide, possibility of applying it to a sputtering target and a possibility as a thin film transistor material are made (Non-Patent Document 2, TABLE IV).

RELATED ART DOCUMENTS

Patent Documents

Patent Document 1: JP-A-H06-234565
Patent Document 2: JP-A-H08-245220
Patent Document 3: JP-A-2007-73312
Patent Document 4: WO2009/084537
Patent Document 5: WO2008/072486
Patent Document 6: JP-A-S63-239117
Patent Document 7: JP-A-2007-281409

Non-Patent Documents

Non-Patent Document 1: J. Am. Ceram. Soc., 82 [10] 2705-2710 (1999)
Non-Patent Document 2: Journal of Solid State Chemistry, 93 [2] 298-315 (1991)

SUMMARY OF THE INVENTION

An object of the invention is to provide an oxide having a novel crystal form which can be preferably used as a sputtering target or the like for providing a semiconductor having a high mobility and a small S value.

As a result of intensive studies, the inventors have found an oxide with a novel crystal structure which is different from the crystal forms such as $In_2O_3(ZnO)_m$ and $InGaO_3(ZnO)_m$ which have been conventionally known. This oxide is assumed to have a crystal structure which is intermediate between a crystal structure represented by $In_2O_3(Zn)_2$ and a crystal structure represented by $InGaO_3(ZnO)_2$. The inventors have also found that an oxide sintered body containing this oxide can be suitably used as a target or the like which is used in preparation of an oxide thin film. The invention has been made based on this finding.

According to the invention, the following oxides or the like can be provided.

1. An oxide comprising indium (In), gallium (Ga) and zinc (Zn), wherein diffraction peaks are observed at positions corresponding to incident angles (2θ) of 7.0° to 8.4°, 30.6° to 32.0°, 33.8° to 35.8°, 53.5° to 56.5° and 56.5° to 59.5° in an X-ray diffraction measurement (CuKα rays), and one of diffraction peaks observed at positions corresponding to incident angles (2θ) of 30.6° to 32.0° and 33.8° to 35.8° is a main peak and the other is a sub peak.

2. The oxide according to 1, wherein the atomic ratio of indium (In), gallium (Ga) and zinc (Zn) satisfies the following formulas (1) and (2):

$$0.45 \leq Zn/(In+Ga+Zn) \leq 0.60 \quad (1)$$

$$0.21 \leq Ga/(In+Ga) \leq 0.29 \quad (2).$$

3. The oxide according to 1 or 2, wherein all metal elements contained in the oxide consist essentially of In, Ga and Zn.
4. An oxide sintered body which comprises the oxide according to one of 1 to 3.
5. The oxide sintered body according to 4, wherein the atomic ratio of indium (In), gallium (Ga) and zinc (Zn) satisfies the following formulas (1') and (2'):

$$0.15 \leq Zn/(In+Ga+Zn) \leq 0.65 \quad (1')$$

$$0.05 \leq Ga/(In+Ga) \leq 0.45 \quad (2').$$

6. A sputtering target comprising the oxide sintered body according to 4 or 5.
7. An oxide thin film formed by using the sputtering target according to 6.
8. A method for producing the oxide according to one of 1 to 3 or the oxide sintered body according to 4 or 5, the sputtering target according to 6, comprising the following steps of:
(a) preparing a shaped body with a thickness of 5.5 mm or more;
(b) sintering the shaped body at a temperature of 1380° C. or more and 1520° C. or less for 4 to 24 hours; and
(c) grinding one or both surfaces of the sintered shaped body by 0.1 mm or more.

According to the invention, it is possible to provide an oxide having a novel crystal form which can be suitably used as a target or the like used for forming an oxide thin film.

BRIEF DESCRIPTION OF THE DRAWINGS

FIG. 2 (*c*) is a conceptual view of the crystal structure of the oxide of the invention;

MODE FOR CARRYING OUT THE INVENTION

Figure 1:
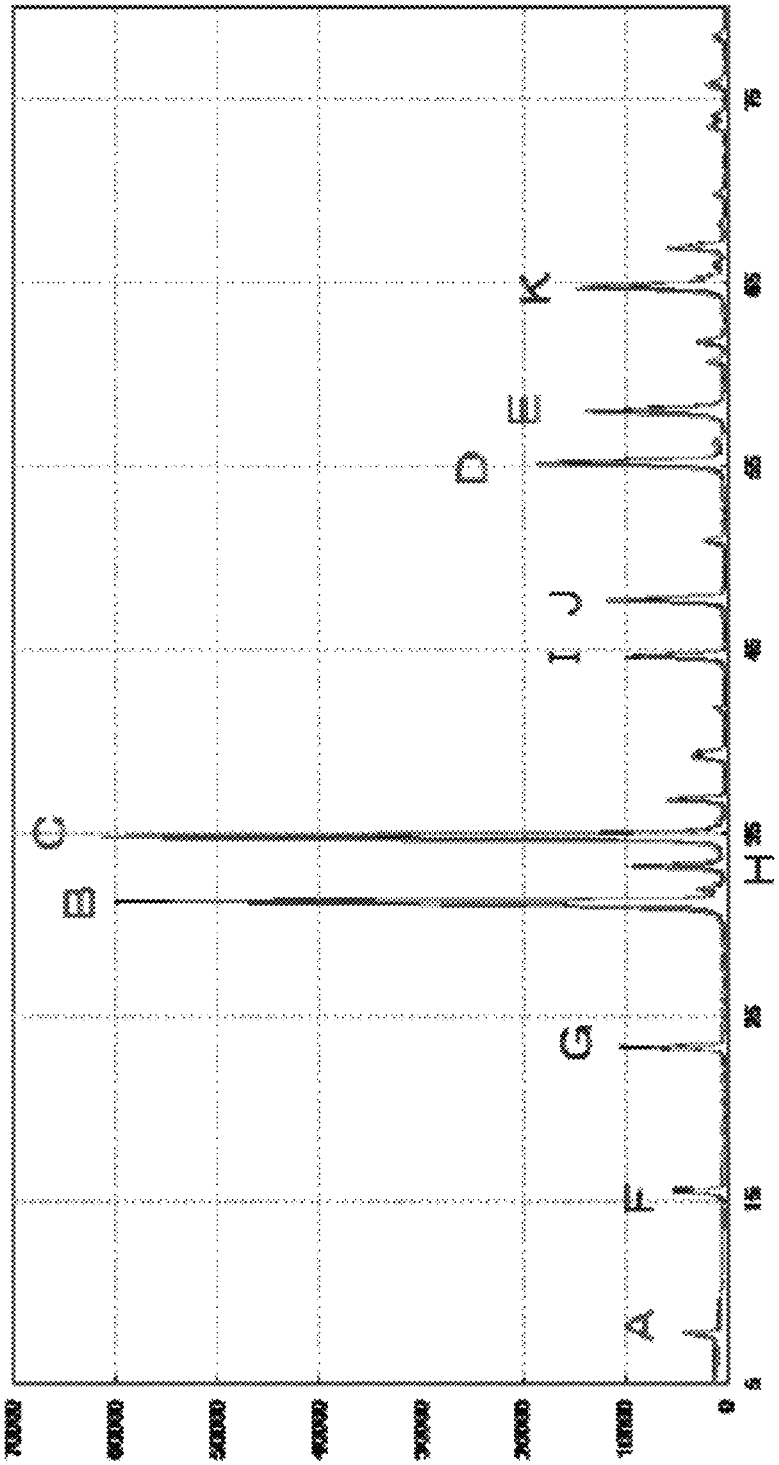
FIG. 1 is an example (Example 1) of an X-ray diffraction chart of the oxide of the invention.

The oxide of the invention is an In—Ga—Zn-based oxide containing an indium element (In), a gallium element (Ga) and a zinc element (Zn), which satisfies the following conditions 1 and 2:

Condition 1: In a chart obtained by an X-ray diffraction measurement (CuKα rays), a diffraction peak is observed in the following regions A to E.

A. Incident angle (2θ)=7.0° to 8.4° (preferably 7.2° to 8.2°)

B. Incident angle (2θ)=30.6° to 32.0° (preferably 30.8° to 31.8°)

C. Incident angle (2θ)=33.8° to 35.8° (preferably 34.3° to 35.3°)

D. Incident angle (2θ)=53.5° to 56.5° (preferably 54.1° to 56.1°)

E. Incident angle (2θ)=56.5° to 59.5° (preferably 57.0° to 59.0°)

Condition 2: One of diffraction peaks observed at 2θ=30.6° to 32.0° (the region B) and at 2θ=33.8° to 35.8° (the region C) is a main peak, and the other is a sub peak.

Meanwhile, the main peak is a peak of which the intensity is largest (that is, a peak of which the height is highest) within a range of 2θ of 5° to 80° and the sub peak is a peak of which the intensity is the second largest.

Further, it is preferred that the following conditions 3 be satisfied.

Condition 3: In a chart obtained by an X-ray diffraction measurement (CuKα rays), diffraction peaks are observed in the following regions F to K.

F. Incident angle (2θ)=14.8° to 16.2° (preferably 15.0° to 16.0°)

G. Incident angle (2θ)=22.3° to 24.3° (preferably 22.8° to 23.8°)

H. Incident angle (2θ)=32.2° to 34.2° (preferably 32.7° to 33.7°)

I. Incident angle (2θ)=43.1° to 46.1° (preferably 43.6° to 45.6°)

J. Incident angle (2θ)=46.2° to 49.2° (preferably 46.7° to 48.7°)

K. Incident angle (2θ)=62.7° to 66.7° (preferably 63.7° to 65.7°)

As an example of the X-ray diffraction chart of the oxide of the invention, an X-ray diffraction chart of the oxide formed in Example 1 is shown in FIG. 1. In the figure, A to K each indicates the above-mentioned peak position. The abscissa axis indicates 2θ and the axis of ordinates indicates intensity.

In the invention, the measurement conditions of the X-ray diffraction are as follows, for example.

Apparatus: Ultima-III, manufactured by Rigaku Corporation
X rays: Cu—Kα rays (wavelength: 1.5406 Å, monochromized by means of a graphite monochrometer) 2θ-θ reflection method, continuous scanning (1.0°/min)
Sampling interval: 0.02°
Slit DS, SS: 2/3°, RS: 0.6 mm Oxide crystals satisfying the above-mentioned conditions 1 and 2 are not found in JCPDS (Joint Committee of Powder Diffraction Standards) cards, and are novel crystals which have not been confirmed so far.

The X-ray diffraction charts of the crystals of the oxides of the invention are similar to the crystal structure represented by $InGaO_3(ZnO)_2$(JCPDS: 40-0252) and the crystal structure represented by $In_2O_3(ZnO)_2$ (JCPDS: 20-1442). However, the oxide of the invention has a peak specific to $InGaO_3(ZnO)_2$ (a peak in the above-mentioned region A) and a peak specific to $In_2O_3(ZnO)_2$ (a peak in the above-mentioned regions D and E). Therefore, it can be judged that the oxide has a novel periodicity which is different from those of $InGaO_3(ZnO)_2$ and $In_2O_3(ZnO)_2$. That is, the oxide of the invention is different from $InGaO_3(ZnO)_2$ and $In_2O_3(ZnO)_2$.

As for the peak of the above-mentioned region B, this peak exists between the main peaks of $In_2O_3(ZnO)_2$ and $InGaO_3(ZnO)_2$ (i.e., between around 31° and around 32°). Therefore, this peak shifts to the lower angle side than the main peak of $InGaO_3(ZnO)_2$ (it appears that the lattice spacing is increased), and this peak shifts to the higher angle side than the main peak of $In_2O_3(ZnO)_2$ (it appears that the lattice spacing is decreased).

The crystal structure of the oxide of the invention appears to be similar to the crystal structure of $InGaO_3(ZnO)_2$ (JCPDS: 40-0252) and to the crystal structure of $In_2O_3(ZnO)_2$ (JCPDS: 20-1442).

Figure 2:
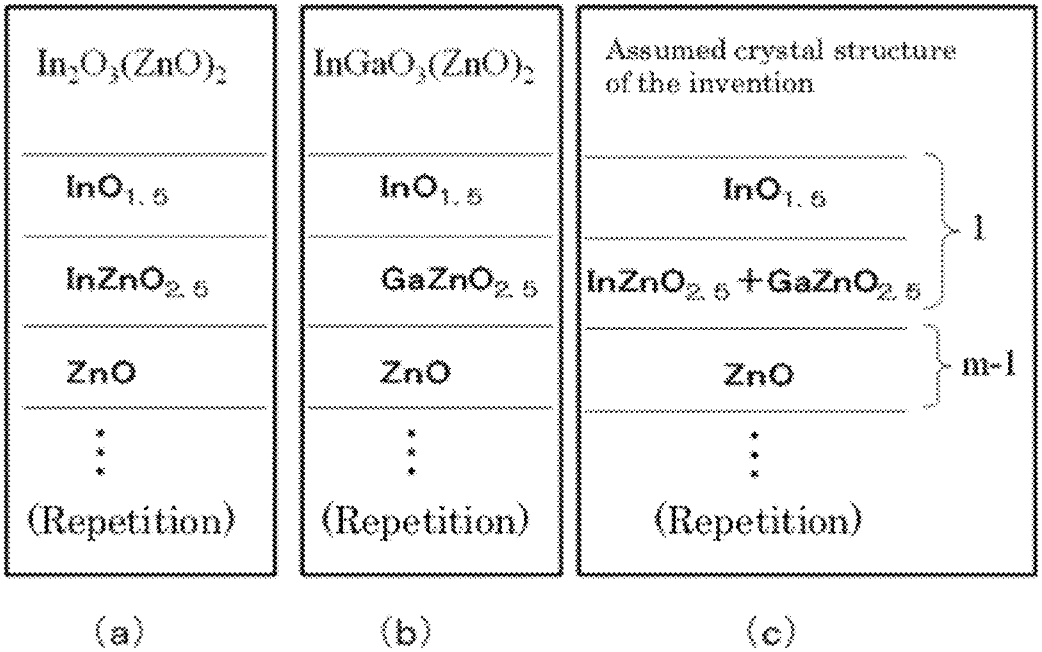
FIG. 2 (*a*) is a conceptual view of the crystal structure of $InGaO_3(ZnO)_2$ and FIG. 2 (*b*) is a conceptual view of the crystal structure of $In_2O_3(ZnO)_2$.

FIG. 2(*a*) shows the crystal structure of $InGaO_3(ZnO)_2$, FIG. 2(*b*) shows the crystal structure of $In_2O_3(ZnO)_2$ and FIG. 2(*c*) shows the assumed crystal structure of the oxide of the invention.

The crystal structure represented by $In_2O_3(ZnO)_m$ (wherein m is an integer of 1 to 20) or $InGaO_3(ZnO)_m$ (wherein m is an integer of 1 to 20) is called the "hexagonal compound" or the "crystal structure in the homologous phase". This is a crystal which is formed of a "natural superlattice" structure having a long period in which crystal layers of different materials are overlapped one on another. If the crystal period or the thickness of each thin film layer is on the level of nanometer, due to combination of the chemical composition or thickness of each layer, specific properties different from a single substance or a mixed crystal obtained by mixing the layers homogenously can be obtained.

The crystal structure of the homologous phase can be confirmed by the fact that the X-ray diffraction pattern directly measured by using pulverized products or sliced pieces of the target, or the target itself, for example, conforms to the X-ray diffraction pattern of the homologous phase assumed from the composition ratio thereof. Specifically, it can be confirmed by the fact that it conforms to the X-ray diffraction pattern of the homologous phase obtained from the JCPDS card.

The crystal structure represented by $In_2O_3(ZnO)_m$ (wherein m is an integer of 1 to 20) is thought to have a structure in which the $InO_{1.5}$ layer, the $InZnO_{2.5}$ layer and the ZnO layer are periodically repeated at a ratio of 1:1:(m−1). Further, as for the crystal structure represented by $InGaO_3(ZnO)_m$ (m is an integer of 1 to 20), it is thought that the $InO_{1.5}$ layer, the $GaZnO_{2.5}$ layer, and the ZnO layer are periodically repeated at a ratio of 1:1:(m−1).

As mentioned above, as for the measurement results by the X-ray diffraction of the crystal structure represented by $In_2O_3(ZnO)_m$ (m is an integer of 1 to 20) or the crystal structure represented by $InGaO_3(ZnO)_m$ (m is an integer of 1 to 20), these structures have similar patterns although the peak positions thereof are different (that is, lattice spacing is different).

It is assumed that the crystal structure of the oxide of the invention is, as in the case of $In_2O_3(ZnO)_m$ or $InGaO_3(ZnO)_m$ mentioned above, a crystal structure formed of the "hexagonal compound" or the "crystal structure in the homologous structure". The oxide of the invention has both a peak specific to $InGaO_3(ZnO)_2$ (peak in the above-mentioned region A) and a peak specific to $In_2O_3(ZnO)_2$ (peak in the above-mentioned regions D and E). From the fact, it can be thought that a layer represented by $In_{1-d}Ga_dZnO_{2.5}$ ($0<d<1$), for example, which is different from the $InZnO_{2.5}$ layer and the $GaZnO_{2.5}$ layer, is generated. That is, it can be assumed that it is a structure in which $InO_{1.5}$ layer, the $In_{1-d}Ga_dZnO_{2.5}$ ($0<d<1$) layer and the ZnO layer ($0<d<1$) are periodically repeated at a ratio of 1:1:(m−1).

Further, it can be thought that the $In_{1-d}Ga_dZnO_{2.5}$ layer ($0<d<1$) is a state in which the $InZnO_{2.5}$ layer and the $GaZnO_{2.5}$ layer are mixed, part of In in the $InZnO_{2.5}$ layer is substituted by Ga or a layer having a new structure containing In, Ga, Zn and O. If it is a state in which part of In in the $InZnO_{2.5}$ layer is substituted by Ga, it is assumed that the $In_{1-d}Ga_dZnO_{2.5}$ layer is a layer in which the In which have been substituted and Ga are in a stable state at a specific ratio. That is, the $In_{1-d}Ga_dZnO_{2.5}$ layer has a substantially novel crystal structure.

In addition, the X-ray diffraction pattern of the crystal structure of the oxide of the invention is particularly similar to that of $In_2O_3(ZnO)_2$. However, it is known that the oxide having a crystal structure of $In_2O_3(ZnO)_2$ is difficult to be synthesized unless it is fired at a high temperature exceeding 1550° C. On the other hand, the crystal structure of the oxide of the Invention can be synthesized at a low temperature of 1550° C. or less. Taking the firing temperature into consideration, this is thought to be a novel crystal structure.

In the oxide of the invention, if it has a diffraction pattern specific to the oxide of the invention by the X-ray diffraction measurement, the amount of oxygen may be excessive or insufficient (oxygen deficiency) (the atomic ratio of the oxygen element may be deviated from the chemical stoichiometric ratio). If the amount of oxygen in the oxide is excessive, the resistance may be too high when it is formed into a target. Therefore, it is preferred that the oxide have oxygen deficiency.

As for the atomic composition of the oxide of the invention, it is preferred that the atomic ratio of an indium element (In), a gallium element (Ga) and a zinc element (Zn) satisfy the following formulas (1) and (2), since the crystal form of the invention can be generated easily as a single structure. If the crystal form of the invention has a single structure, it is expected that a sintered body cannot be broken easily, the target can be handled more easily, and the quality of each of the sintered body, the target and the thin film after film formation is stabilized.

$$0.45 \leq Zn/(In+Ga+Zn) \leq 0.60 \quad (1)$$

$$0.21 \leq Ga/(In+Ga) \leq 0.29 \quad (2)$$

In the above-mentioned formula (1), the crystal form of the invention can be generated easily if the atomic ratio of Zn is 0.45 or more and 0.60 or less, preferably close to 0.5. The reason therefor is that, with this atomic ratio, the crystal structure in which m is equal to 2, that is, a structure in which the $InO_{1.5}$ layer, the $In_{1-d}Ga_dZnO_{2.5}$ layer ($0<d<1$) and the ZnO layer are periodically repeated at a ratio of 1:1:1 can be easily formed.

In the above-mentioned formula (2), if the ratio of Ga is 0.21 to 0.29, in particular, 0.22 to 0.28, the crystal form of the invention can be easily generated.

If the atomic ratio of Ga in the formula (3) is closer to 0.25, the crystal characteristic of the invention can be easily generated.

Conventionally, it was believed that an oxide sintered body sputtering target composed of a single crystal is difficult to produce unless the Ga/(In+Ga) is 0.0 or 0.5. Therefore, it is surprising that the oxide sintered body sputtering target composed of the crystal of the invention can be prepared at a Ga/(In+Ga) of around 0.25.

The atomic ratio of the each element contained in the oxide of the invention can be obtained by quantitatively analyzing the elements contained by Inductively Coupled Plasma Atomic Emission Spectroscopy (ICP-AES).

Specifically, in an analysis using ICP-AES, a sample solution is atomized by means of a nebulizer, and then introduced into argon plasma (about 6000 to 8000° C.). The elements in the sample are excited by absorbing thermal energy, whereby orbit electrons are transferred from the ground state to an orbit with a higher energy level. These orbit electrons are transferred to an orbit with a lower energy level within $10^{-7}$ to $10^{-8}$ seconds. At this time, difference in energy is radiated as light to cause emission. Since this light has a wavelength (spectral line) peculiar to the element, the presence of the element can be confirmed by the presence of the spectral line (qualitative analysis).

Further, since the amplitude of each of the spectral line (emission intensity) increases in proportion to the number of elements contained in a sample, the concentration of a sample solution can be obtained by comparing a sample solution with a standard solution with a known concentration (quantitative analysis).

After identifying the element contained by a qualitative analysis, the content thereof is obtained by a quantitative analysis. From the results, the atomic ratio of each element is obtained.

In the invention, other metal elements than In, Ga and Zn, as mentioned above, e.g. Sn, Ge, Si, Ti, Zr, Hf or the like, may be contained in an amount which does not impair the advantageous effects of the invention.

In the invention, the metal elements contained in the target may essentially consist of In, Ga and Zn. The "essentially" means that no other than elements than impurities or the like which are originally contained in raw materials or inevitably mixed in during the production process or the like. Normally, the amount of impurities which are inevitably mixed in is less than 100 ppm, preferably less than 50 ppm, with less than 10 ppm being particularly preferable.

The oxide of the invention can be produced by sintering raw material powder containing each metal element, for example. The production process will be explained hereinbelow.

(1) Mixing Process

Mixing of raw materials is an essential process of mixing compounds of metal elements contained in the oxide of the invention. Preferably, the raw materials are mixed such that the atomic ratio of the resulting oxide satisfies the above-mentioned formulas (1) and (2).

As the raw material, powder of an indium compound, powder of a gallium compound, powder of a zinc compound or the like is used. As the compound of indium, indium oxide, indium hydroxide or the like can be given, for example. As the compound of zinc, zinc oxide, zinc hydroxide or the like can be given, for example. As for the compound of each element, an oxide is preferable since sintering can be conducted easily and bi-products are hardly remained.

As for the purity of the raw material, the purity is normally 2N (99 mass %) or more, preferably 3N (99.9 mass %) or more, with 4N (99.99 mass %) or more being particularly preferable. If the purity is lower than 2N, the durability may be lowered, or burn-in may occur due to entering of impurities to the liquid crystal.

It is preferred that metal zinc (zinc powder) be used as part of the raw material. By using zinc powder as part of the raw material, generation of white spots can be suppressed.

It is preferred that raw materials such as metal oxides used for the production of a target be mixed and be uniformly mixed and pulverized by means of a common pulverizer, e.g. a wet ball mill, a wet bead mill or an ultrasonic apparatus.

(2) Pre-Firing

In the pre-firing step, a mixture obtained by the above-mentioned step is pre-fired. This step is a step which is optionally provided according to need. By the pre-firing step, although the density of the oxide can be easily increased, the production cost may also be increased. Therefore, it is more preferred that the density be increased without conducting pre-firing.

In the pre-firing step, it is preferred that the above-mentioned mixture be heat-treated at 500 to 1200° C. for 1 to 100 hours. If a heat treatment is conducted at less than 500° C. or for shorter than 1 hour, thermal decomposition of an indium compound, a zinc compound or a tin compound may be insufficient. If the heat treatment is conducted at a temperature higher than 1200° C. or for exceeding 100 hours, coarsening of particles may occur.

Therefore, it is particularly preferred that a heat treatment (pre-firing) be conducted at a temperature range of 800 to 1200° C. for 2 to 50 hours.

It is preferred that a pre-fired product obtained in this step be pulverized before the following shaping and firing steps.

(3) Shaping Step

A shaping step is a step in which the mixture obtained in the above-mentioned mixing step (the pre-fired product, if the above-mentioned pre-firing step is provided) is shaped under pressure, thereby to obtain a shaped product. By this step, the mixture or the pre-fired product is shaped into a desired shape of a product (for example, a shape which is suited for a target). If the pre-firing step is provided, after granulating fine powder of the resulting pre-fired product, the granulated product is press-shaped into a desired shape.

As for the shaping, die shaping, cast shaping, inject shaping or the like can be mentioned, for example. In order to obtain a sintered body (target) having a high sintered density, it is preferable to conduct shaping by cold isostatic pressing (CIP) or the like.

In the shaping, a shaping aid such as polyvinyl alcohol, methyl cellulose, polywax, oleic acid or the like may be used.

It is preferred that the thickness of the shaped product be 5.5 mm or more. If the thickness of the shaped body is less than 5.5 mm, the crystal form of the invention may not be obtained when sintered or other crystal forms than that of the invention may be precipitated. It is assumed that the reason therefor is that temperature irreguralty or the like in the plane which is caused during sintering due to the small thickness of the shaped product.

The thickness of the shaped product is more preferably 6.0 mm, with 7 mm or more being particularly preferable.

(4) Sintering Step

A sintering step is an essential step in which the mixture obtained in the above-mentioned mixing step (the pre-fired product, if the above-mentioned pre-firing step is provided) or the shaped product obtained in the above-mentioned shaping step is sintered.

Sintering can be conducted by hot isostatic pressing (HIP) or the like.

In order to obtain the crystal structure of the invention, sintering is conducted at a temperature of preferably exceeding 1350° C. and lower than 1550° C., more preferably 1380° C. or higher and 1520° C. or lower, with 1390° C. to 1480° C. being particularly preferable. Outside the above-mentioned range, the crystal form of the invention may not be formed. Within the above-mentioned range, the relative density can be improved and the bulk resistance can be lowered.

In order to obtain the crystal structure of the invention, it is preferred that sintering be conducted for 2 to 48 hours, more preferably 4 to 24 hours.

Sintering can be conducted in an oxygen gas atmosphere or under oxygen gas pressure, or under atmosphere. On the other hand, if firing is conducted in an atmosphere which does not contain oxygen or at a temperature of 1550° C. or higher, the density of the resulting oxide sintered body cannot be improved sufficiently, and generation of abnormal discharge during sputtering cannot be fully suppressed.

During firing, the temperature is elevated normally at a rate of 8° C./min or less, preferably 4° C./min or less, more preferably 3° C./min or less, and further preferably 2° C./min or less. If the temperature is elevated at a rate of 8° C./min or less, the crystal form of the invention can be easily obtained. Further, at this heating, cracks hardly occur.

During firing, the temperature is lowered normally at a rate of 4° C./min or less, preferably 2° C./min or less, more preferably 1° C./min or less, further preferably 0.8° C./min or less, and particularly preferably 0.5° C./min or less. If the temperature is lowered at a rate of 4° C./min or less, the crystal form of the invention can be obtained easily. Further, at this cooling rate, cracks hardly occur.

As for heating or cooling, it is possible to change the temperature in a stepwise manner.

(5) Reduction Step

A reduction step is a step which is optionally provided according to need in order to homogenize the bulk resistance of the sintered product obtained in the above-mentioned firing step in the entire target.

As for the reduction method which can be applied in this step, reduction using a reductive gas, reduction by vacuum firing, reduction with an inert gas or the like can be given.

In the case of a reduction treatment with a reductive gas, hydrogen, methane, carbon monoxide or a mixed gas with these gases and oxygen or the like can be used.

In the case of a reduction treatment by firing in an inert gas, nitrogen, argon, or, a mixed gas with these gases and oxygen or the like can be used.

Reduction is normally at a temperature of 100 to 800° C., preferably 200 to 800° C. The reduction is normally conducted for 0.01 to 10 hours, preferably 0.05 to 5 hours.

By the above-mentioned steps, a simple substance of the oxide of the invention or an oxide sintered body containing the oxide of the invention can be obtained. The oxide sintered body containing the oxide of the invention has a high relative density, a low resistance, a high bending strength and high uniformity, and therefore, is suited as a target for preparing an oxide semiconductor or an oxide thin film such as a transparent conductive film. That is, by allowing the crystal structure of the invention to be generated, a more preferable target can be produced even if it has a composition which is different from that of the crystal form which has conventionally been known.

Further, it is particular preferred that the target of the invention exhibit only the crystal form specific to the oxide of the invention and do not exhibit other crystal forms, since a high target strength (transverse rupture strength or impact strength) or high reproducibility of target production can be expected.

It is preferred that the oxide sintered body for a sputtering target containing the oxide of the invention satisfy the following formulas (1') and (2'):

$$0.15 \leq Zn/(In+Ga+Zn) \leq 0.65 \quad (1')$$

$$0.05 < Ga/(In+Ga) < 0.45 \quad (2')$$

In the above formula (1'), if the amount ratio of Zn is less than 0.15 or exceeds 0.65, the crystal structure of the invention in the oxide sintered body may be instable (decomposed).

The ratio of Zn is preferably 0.25 to 0.60, with 0.45 to 0.55 being particularly preferable.

If the atomic ratio of Zn in the above-mentioned formula (1') is close to 0.5, the oxide sintered body can have the crystal structure of the invention easily.

In the above-mentioned formula (2'), if the amount ratio of Ga is 0.05 or less, if a thin film transistor (semiconductor thin film) is formed, for example, moisture resistance may be lowered or the speed of wet etching may become too fast. Further, if the amount ratio of Ga is 0.45 or more, the resistance of the oxide may be increased or the mobility may be lowered when a thin film transistor (semiconductor thin film) is fabricated.

The amount ratio of Ga is preferably 0.10 to 0.40, further preferably 0.15 to 0.35, with 0.17 to 0.33 being particularly preferable.

In particular, if the amount ratio of Ga is 0.17 to 0.33, the crystal form of the invention can be generated easily. If the amount ratio of Ga is less than 0.17, the moisture resistance may be lowered or the speed during wet etching may become too fast when a thin film transistor (semiconductor thin film) is fabricated By processing the oxide sintered body of the invention into a desired shape according to need, a final product can be obtained. Hereinbelow, an example in which the oxide sintered body is processed into a sputtering target will be explained.

Processing is conducted in order to cut the above-mentioned oxide sintered body into a shape which is suitable for mounting on a sputtering apparatus, as well as to provide a mounting jig such as a backing plate. In order to form an oxide sintered body to be a sputtering target, the sintered body is ground by means of a plane grinder to allow the surface roughness Ra to be 5 μm or less. Further, the sputtering surface of the target may be subjected to mirror finishing, thereby allowing the average surface roughness Ra thereof to be 1000 Å or less. For this mirror finishing (polishing), known polishing techniques such as mechanical polishing, chemical polishing, mechano-chemical polishing (combination of mechanical polishing and chemical polishing) or the like may be used. For example, it can be obtained by polishing by means of a fixed abrasive polisher (polishing liquid: water) to attain a roughness of #2000 or more, or can be obtained by a process in which, after lapping by a free abrasive lap (polisher: SiC paste or the like), lapping is conducted by using diamond paste as a polisher instead of the SiC paste. There are no specific restrictions on these polishing methods.

It is preferred that the grinding be conducted by 0.1 mm or more, more preferably 0.3 mm or more, further preferably 0.5 mm or more and particularly preferably 1 mm or more. By grinding by 0.1 mm or more, a part near the surface in which the composition is deviated that is generated by evaporation of components such as zinc or a part where unintended crystals are precipitated can be removed.

The resulting sputtering target is bonded to a backing plate. The thickness of the target is usually 2 to 20 mm, preferably 3 to 12 mm, and particularly preferably 4 to 6 mm. Further, it is possible to mount a plurality of targets on a single backing plate to use them as substantially a single target.

After polishing, the target is cleaned. For cleaning, air blowing, washing with running water or the like can be used. When foreign matters are removed by air blowing, foreign matters can be removed more effectively by air intake by means of a dust collector from the side opposite from the air blow nozzle. Since the above-mentioned air blow or washing with running water has its limit, ultrasonic cleaning or the like can also be conducted. In ultrasonic cleaning, it is effective to conduct multiplex oscillation within a frequency range of 25 to 300 KHz. For example, it is preferable to perform ultrasonic cleaning every 25 KHz in a frequency range of 25 to 300 KHz by subjecting 12 kinds of frequency to multiplex oscillation.

The sputtering target formed of the oxide sintered body of the invention preferably has a relative density of 92% or more, more preferably 95% or more, and particularly preferably 98% or more. If the relative density is less than 92%, the target may tend to be broken easily or abnormal discharge may generate easily.

The relative density is a density which is calculated relatively to the theoretical density which has been calculated from the weighted average. The density calculated from the weighted average of the density of each of the raw materials is the theoretical density, which is taken as 100%.

The resistance of the target is preferably 0.01 mΩcm or more and 20 mΩcm or less, more preferably 0.1 mΩcm or more and 10 mΩcm or less, and particularly preferably 0.2 mΩcm or more and 5 mΩcm or less. If the resistance exceeds 20 mΩcm, spark may occur due to abnormal discharge when DC sputtering is conducted for a long period of time. As a result, the target may be cracked or particles which have been jumped out from the target by spark may adhere to the substrate for film formation, causing performance as the oxide semiconductor film to be lowered. If the resistance is smaller than 0.01 mΩcm, the resistance of the target becomes smaller than the resistance of particles, and abnormal discharge may occur due to the particles which have been jumped out.

The transverse rupture strength of the target is preferably 50 MPa or more, more preferably 60 MPa or more, with 70 MPa or more being particularly preferable.

It is preferred that the range of a variation of positive elements other than zinc in the target be within 0.5%. If it is within 0.5%, the uniformity of the resistance of the target can be improved (variation can be suppressed). Further, a variation in a shaped product can be suppressed.

The range of a variation of a positive element can be obtained by a method in which samples which have been collected from 5 or more parts on the target surface are subjected to a quantitative analysis by means of an inductively coupled plasma atomic emission spectrometry (ICP-AES). [0047]

It is preferred that the range of a variation of relative density in the target be within 3%. If the range of a variation of relative density is within 3%, the uniformity of resistance of the target can be improved (variation can be suppressed). Further, a variation in the formed film can be suppressed.

The variation in relative density is obtained by cutting arbitral 10 parts of the sintered body, obtaining the relative density thereof by the Archimedean Law and calculating from the following formula based on the average value, the maximum value and the minimum value.

$$\text{Variation in relative density}=(\text{Maximum}-\text{Minimum})/\text{Average}\times 100(\%)$$

The number of pinholes with a Ferret diameter of 2 μm or more in the target is preferably 50 pinholes/mm$^2$ or less, more preferably 20 pinholes/mm$^2$ or less, and further preferable 5 pinholes/mm$^2$ or less. It is not preferred that a number of pinholes with a Ferret diameter be 2 μm or more of larger than 50 pinholes/mm$^2$ since abnormal discharge may occur frequently from the initial stage to the final stage of using the target. In addition, with that number of pinholes, the smoothness of the resulting sputtering film tends to be lowered. If the number of pinholes with a Ferret diameter of 2 μm or more in the sintered body is 5 pinholes/mm$^2$ or less, occurrence of abnormal discharge can be suppressed from the initial stage to the final stage of using the target. Further, the resulting sputtering film is very smooth.

Here, the Ferret diameter means a distance between parallel lines sandwiching a particle in a fixed direction, if a pinhole is assumed as the particle.

If can be measured by observing an SEM image with a magnification of 100 times.

By sputtering an object such as a substrate by using the sputtering target of the invention, a thin film of the oxide of the invention can be formed. The oxide thin film can be preferably used in a transparent electrode, a semiconductor layer or an oxide thin film layer of a thin film transistor. Of them, the oxide thin film can be particularly preferably used for a semiconductor layer of a thin film transistor.

The transistor characteristics can be evaluated according to various criteria, such as field effect mobility μ, threshold voltage (Vth), on-off ratio and S value.

The field effect mobility can be obtained from characteristics such as properties of a linear region or a saturation region. For example, a graph of √Id−Vg is prepared from the results of the transfer properties, and a field mobility is obtained from the gradient of the graph. Unless otherwise specified, in this specification, the field effect mobility is evaluated by this method.

Although there are some methods for obtaining a threshold voltage, a threshold voltage Vth can be induced from the x intercept of a √Id−Vg graph.

The on-off ratio can be obtained from the ratio of the largest Id to the smallest Id in the transfer properties.

The S value can be obtained from the reciprocal number of the gradient of a Log(Id)−Vd graph which is prepared from the results of the transfer properties.

The unit of the S value is V/decade, and a smaller S value is preferable.

The S value is preferably 0.5V/dec or less, more preferably 0.4V/dec or less, further preferably 0.3V/dec or less and particularly preferably 0.2V/dec or less. If the S value is 0.8V/dec or less, the driving voltage becomes small, and as a result, the power consumption may be decreased. In particular, if used in an organic EL display, since an organic EL display is driven by direct current, an S value of 0.3V/dec or less is preferable since power consumption can be significantly decreased. The S value (Swing Factor) is a value indicating the steepness of a rise when the drain current rapidly rises from the off state to the on state when the gate voltage is increased from the off state. As defined by the following formula, an increase in gate voltage when the drain current rises by one digit (10 times) is defined as the S value.

$$S\ \text{value}=dVg/d\log(Ids)$$

A steeper rise in drain current means a smaller S value ("Thin Film Transistor", written by Ikuhiro Ukai, published 2007, Kogyo Chosakai Publishing Co., Ltd.). If the S value is large, a high gate voltage is required to be applied when switching ON to OFF, which may result in an increase in consumption power.

In the field effect transistor of the invention, the mobility is preferably 8 cm$^2$/Vs or more, more preferably 10 cm$^2$/Vs or more, further preferably 16 cm$^2$/Vs or more, and particularly preferably 20 cm$^2$/Vs or more. If the mobility is 8 cm$^2$/Vs or more, the switching speed may be increased, and advantages can be expected when used in a large-sized high-definition display.

The on-off ratio is preferably $10^7$ or more, more preferably $10^8$ or more, and particularly preferably $10^9$ or more.

The threshold voltage is normally −1 to 5V, preferably −0.5 to 3V, more preferably 0 to 2V, with 0 to 1V being particularly preferable. If the threshold voltage is larger than −1V, a lower voltage is applied during the OFF state, whereby power consumption may be decreased. If the threshold voltage is smaller than 5V, the driving voltage is decreased, whereby power consumption may be decreased.

EXAMPLES

Example 1

(1) Preparation of an Oxide Sintered Body

As a starting material, $In_2O_3$ (manufactured by Nippon Rare Metal, Inc: purity 4N), $Ga_2O_3$ (manufactured by Nippon Rare Metal, Inc: purity 4N) and ZnO (manufactured by Kojundo Chemical Laboratory Co., Ltd.: purity 4N) were used.

These raw materials were weighed such that the atomic ratios of the metal elements became the ratios shown in Table 1. The raw materials were then mixed and pulverized by means of an agitator bead mill with a wet medium. As the medium for the agitator bead mill with a wet medium, zirconia beads having a diameter of 1 mm were used.

After mixing and pulverizing, the resulting mixture was dried by means of a spray dryer, and put in a mold, and pressed using a cold press machine to obtain a shaped body.

Thereafter, the shaped body was sintered in an electric furnace. The sintering conditions are as follows.

Heating rate: 2° C./min

Sintering temperature: 1480° C.

Sintering time: 6 hours

Sintering atmosphere: Oxygen flow

Cooling time: 72 hours

(2) Preparation of a Sputtering Target

After sintering, a sintered body with a thickness of 6 mm was obtained. From this sintered body, a sintered body for a sputtering target was cut out. The corners of this sintered body were cut by means of a diamond cutter. Each of the both surfaces was ground by 0.5 mm by means of a plane grinder, whereby a target material having a surface roughness Ra of 5 μm or less, a thickness of 5 mm and a diameter of 4 inches was obtained.

Subsequently, the surface of the target material was blown by air, and then ultrasonic cleaning was conducted for 3 minutes every 25 kHz in a frequency range of 25 to 300 kHz by subjecting 12 kinds of frequency to multiplex oscillation.

As a result, a target material was obtained.

Thereafter, the target material was bonded to a backing plate made of oxygen-free copper by means of indium solder, whereby a target was obtained. The target has a surface roughness of Ra 0.5 μm and a grounded surface with no direction.

The thus produced target was installed in a DC sputtering film forming apparatus. Continuous sputtering was conducted at 100 W for 100 hours in an argon atmosphere of 0.3 Pa, and nodules formed on the surface were counted. As a result, almost no nodules were formed on the target surface. Further, almost no abnormal discharge occurred during the film formation.

For the resulting oxide sintered body (target), the following evaluation was conducted. The results are shown in Table 1.

(A) Atomic Ratio of Metal Elements in the Oxide Sintered Body (Target)

Samples were collected from the surface of the oxide sintered body (target), and the collected samples were analyzed by means of an ICP atomic emission spectrometer (manufactured by Shimadzu Corporation).

(B) Crystal Structure of the Oxide Sintered Body (Target)

The crystal structure was judged by directly measuring the surface of the thus produced oxide sintered body (target) by the X-ray diffraction (XRD) (if the target is too large, measurement may be conducted by cutting out parts to be measured).

Apparatus: "Ultima-III" manufactured by Rigaku Corporation

X-rays: Cu—Kα radiation (wavelength: 1.5406 Å, monochromatized using a graphite monochrometor) 2θ-θ reflection method, continuous scan (1.0°/min)

Sampling interval: 0.02°

Slit DS, SS: 2/3°, RS: 0.6 mm (C) Properties of the Target (a) Relative Density

Relative density was measured by the following formula based on the theoretical density calculated from the density of the raw material powder and the density of the sintered body measured by the Archimedian method.

Relative density=(Density measured by the Archimedian method)/(Theoretical density)×100(%)

(b) Bulk Resistance

Bulk resistance was measured by the four probe method (JIS R1637) using a resistivity meter (Loresta, manufactured by Mitsubishi Chemical Corporation). The average value of the resistivity values of ten points is taken as the value of resistivity.

(c) Uniformity of Resistance

Uniformity of resistance was measured by the four probe method (JIS R1637) using a resistivity meter (Loresta, manufactured by Mitsubishi Chemical Corporation). From the average value of the resistivity values of ten points and the standard deviation, calculation was made by the following formula:

(Standard deviation)/(Average value)×100(%)

(d) Number of Pinholes (Average Number of Voids)

After subjecting to mirror polishing in an arbitral direction, the sintered body was etched. The structure was observed by means of a SEM (scanning electron microscope), and the number of voids with a diameter of 1 μm or more per unit area was counted.

(D) Film-Forming Properties of the Target (a) Abnormal Discharge

The number of abnormal discharge occurred in 96 hours was counted.

(b) Particles (Amount of Generated Dust)

The particles were evaluated as follows.

A slide glass was set in a chamber. The density of a particle with a diameter of 1 μm or more which had been attached to the slide glass after 96-hour continuous film formation was measured by means of a microscope.

Evaluation was conducted according to the following three stages in ascending order of the number of particles.

$\leq 10^2$: equal to or smaller than $10^2/cm^2$ $\leq 10^4$: larger than $10^2/cm^2$ and equal to or smaller than $10^4/cm^2$ $10^4<$: exceeding $10^4/cm^2$ (c) Amount of Nodules Evaluation was conducted as follows.

The sputtering target after 96-hour continuous film formation was visually confirmed under room light, and evaluated according to the following three stages.

No: Almost no nodules were formed.

Small: Slight amount of nodules were formed.

Large: Large amount of nodules were formed.

Figure 3:
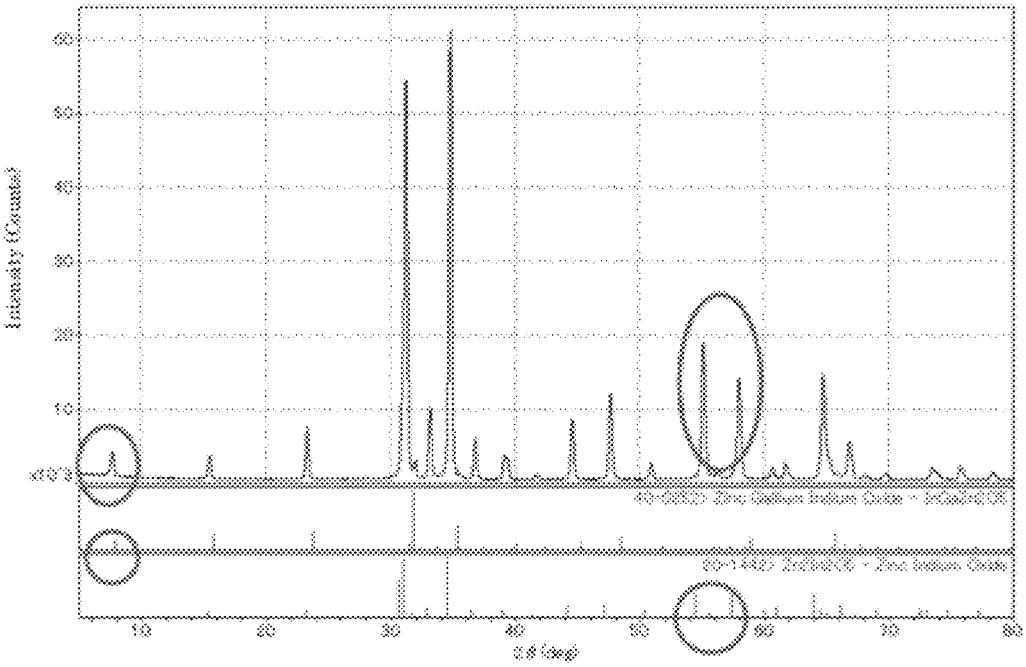
FIG. 3 is an X-ray diffraction chart of the oxide sintered body formed in Example 1.

An X-ray diffraction (XRD) chart of the target produced in Example 1 is shown in FIG. 3. For the purpose of comparison, below the XRD chart, the chart of $InGaO_3(ZnO)_2$ (JCPDS: 40-0252) and the chart of $In_2O_3(ZnO)_2$ (JCPDS: 20-1442) are shown.

The oxide of Example 1 had a peak specific to $InGaO_3(ZnO)_2$ (indicated by ○ in FIG. 3) and a peak specific to $In_2O_3(SnO)_2$ (indicated by ○ in FIG. 3), and had a peak which was not observed in $InGaO_3(ZnO)_2$ and $In_2O_3(SnO)_2$. Therefore, this oxide had a novel crystal form different from that of $InGaO_3(ZnO)_2$ and $In_2O_3(SnO)_2$.

(E) Characteristics of the Transistor

Figure 4:
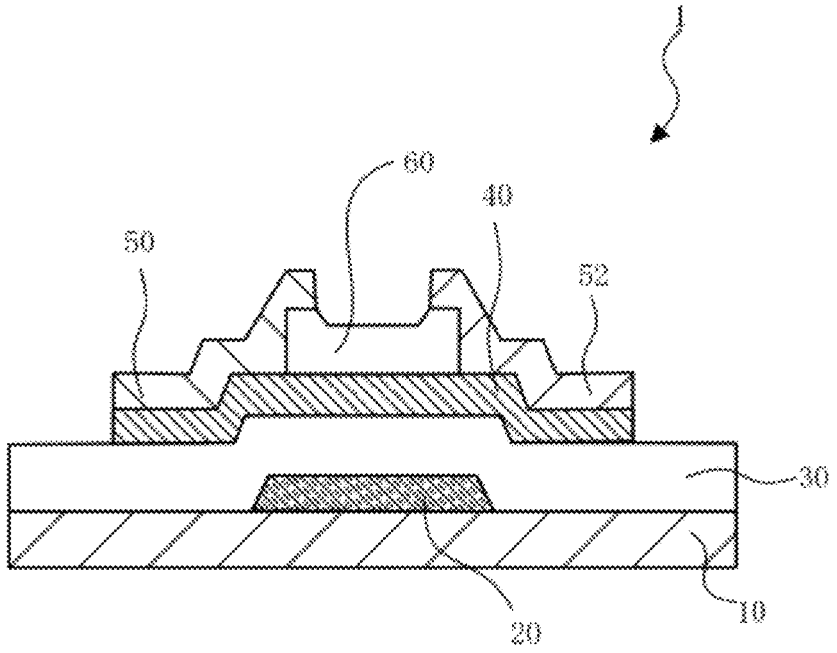
FIG. 4 is a schematic cross-sectional view of the thin film transistor prepared in the Examples.

A channel stopper thin film transistor shown in FIG. 4 (inverted staggered thin film transistor) was produced and evaluated.

As a substrate 10, a glass substrate (Corning 1737) was used. First, on the glass substrate 10, a 10 nm-thick Mo film, an 80 nm-thick Al film and a 10 nm-thick Mo film were stacked in this sequence. The stacked film was formed into a gate electrode 20 by the photolithographic method and the lift-off method.

On the gate electrode 20 and the substrate 10, a 200 nm-thick $SiO_2$ film was formed by the TEOS-CVD method, whereby a gate insulating layer 30 was formed. The gate insulating layer may be formed by the sputtering method, but it may preferably be formed by the CVD method such as the TEOS-CVD method or the PECVD method. If the sputtering method is used, off current may be increased.

Subsequently, by the RF sputtering method, a 40 nm-thick semiconductor film 40 (channel layer) was formed by using the target prepared in Example 1. On the semiconductor film 40, an $SiO_2$ film was formed as an etching stopper layer 60 (protective film) by the sputtering method. The protective film may be formed by the CVD method.

In this example, input RF power is 200 W. The atmosphere at the time of film formation was 0.4 Pa (total pressure) and the gas flow ratio at this time is $Ar:O_2=92:8$. The substrate temperature is 70° C. The oxide semiconductor film and the protective film thus stacked were processed into an appropriate size by the photographic method and the etching method.

After the formation of the etching stopper layer 60, a 5 nm-thick Mo film, a 50 nm-thick Al film and a 5 nm-thick Mo film were stacked in this order, and a source electrode 50 and a drain electrode 52 were formed by the photolithographic method and dry etching.

Thereafter, a heat treatment was conducted at 300° C. for 60 minutes in the atmosphere, whereby a transistor with a channel length of 10 μm and a channel width of 100 μm was produced.

The thin film transistor was evaluated as follows.

(a) Mobility (Field Effect Mobility (μ)), S Value and On-Off Ratio

Mobility, S value and on-off ratio were measured by means of a semiconductor parameter analyzer (4200, manufactured by Keithley Instruments, Inc.) at room temperature in a light-shielding environment.

(b) Moisture Resistance

A moisture resistance test was conducted at 85° C. and 85% RH for 120 hours. A shift in threshold voltage (Vth) before and after the test was evaluated as follows.

Shift amount of 5V or less: ≤5V

Shift amount exceeding 5V: 5V<

(c) Variation in Threshold Voltage (Vth)

From the maximum value and the minimum value of the threshold voltage (Vth) of 20 thin film transistors prepared simultaneously, a variation in threshold voltage was obtained based on the following formula:

$$\text{Variation in threshold voltage}(Vth)=\text{Maximum value}-\text{Minimum value}$$

Example 2

A sputtering target composed of an oxide sintered body was prepared and evaluated in the same manner as in Example 1, except that the heating rate was changed to 1° C./min, the sintering time was changed to 12 hours and processing was conducted such that the surface of a 9 mm-thick sintered body was ground to 5 mm and polished. The results are shown in Table 1.

Example 3

The same starting materials as those in Example 1 were mixed in an amount ratio shown in Table 1. Mixing was conducted for 24 hours in a ball mill.

The resulting mixture was shaped by CI P, and sintered in an electric furnace. The sintering conditions are as follows.

Heating rate: 2.5° C./min

Sintering temperature: 1400° C.

Sintering time: 6 hours

Sintering atmosphere: In atmosphere

Cooling time: 72 hours

The thus produced sintered body with a thickness of 6 mm was ground into a thickness of 5 mm, followed by polishing. A sputtering target was fabricated and evaluated in the same manner as in Example 1, except that a circular sintered body for a target having a diameter of 4 inches and a thickness of 5 mm was cut out. The results are shown in Table 1.

Figure 5:
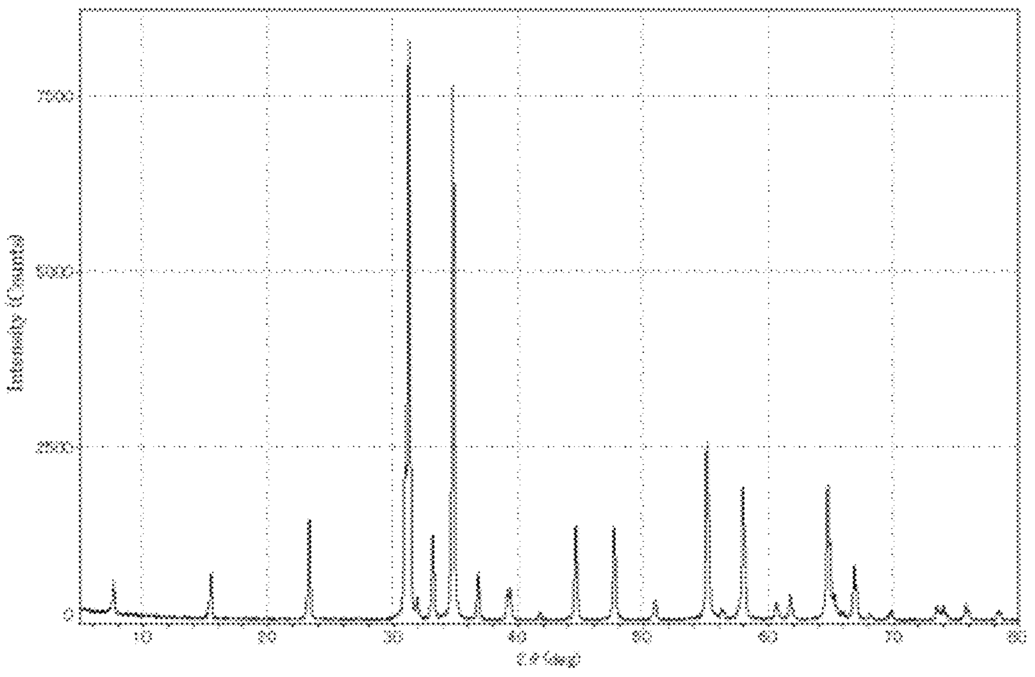
FIG. 5 is an X-ray diffraction chart of the oxide sintered body prepared in Example 3.
Figure 6:
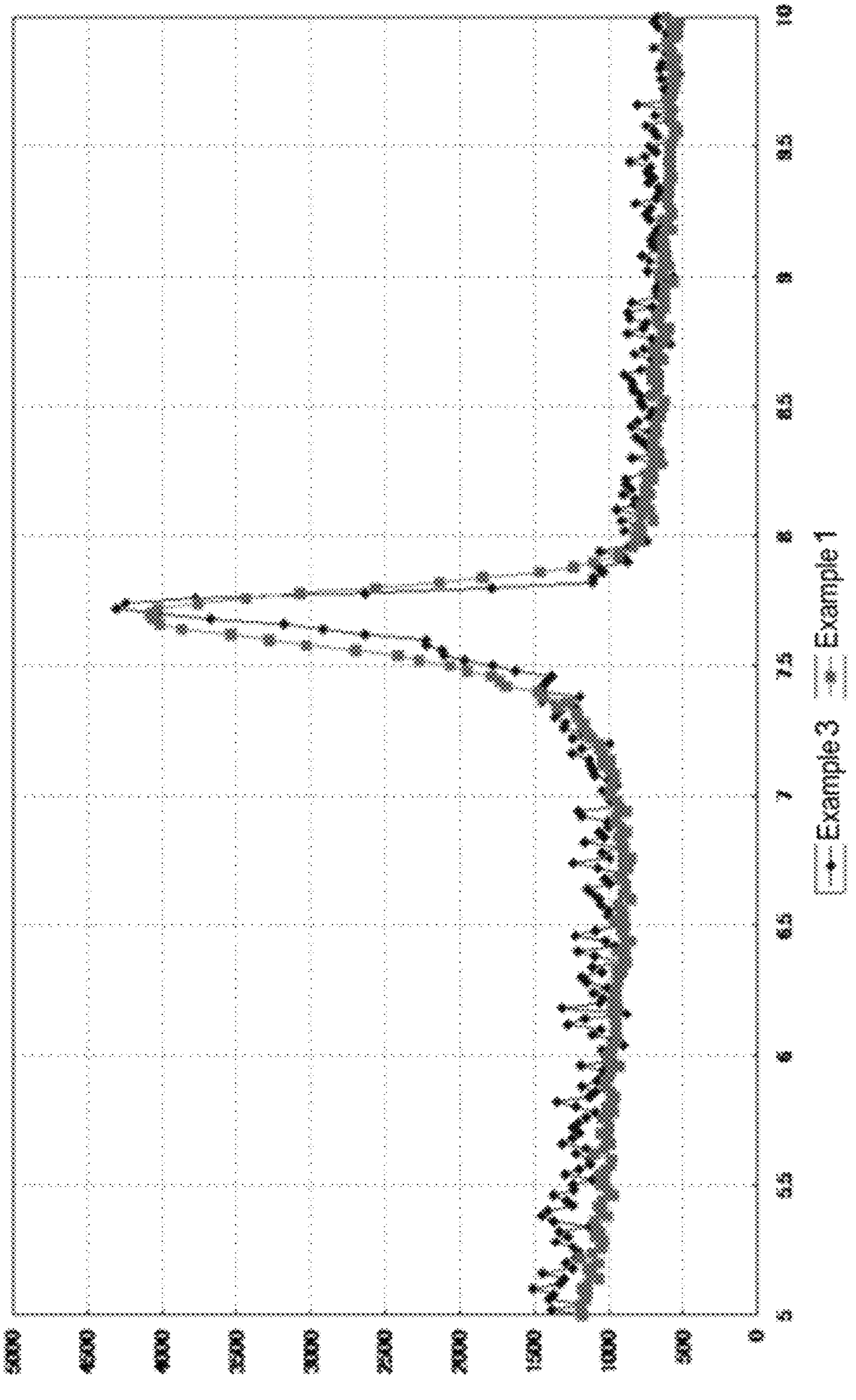
FIG. 6 is an enlarged view of an X-ray diffraction chart of the oxide sintered body prepared in Examples 1 and 3 (2θ=5° to 10°)
Figure 7:
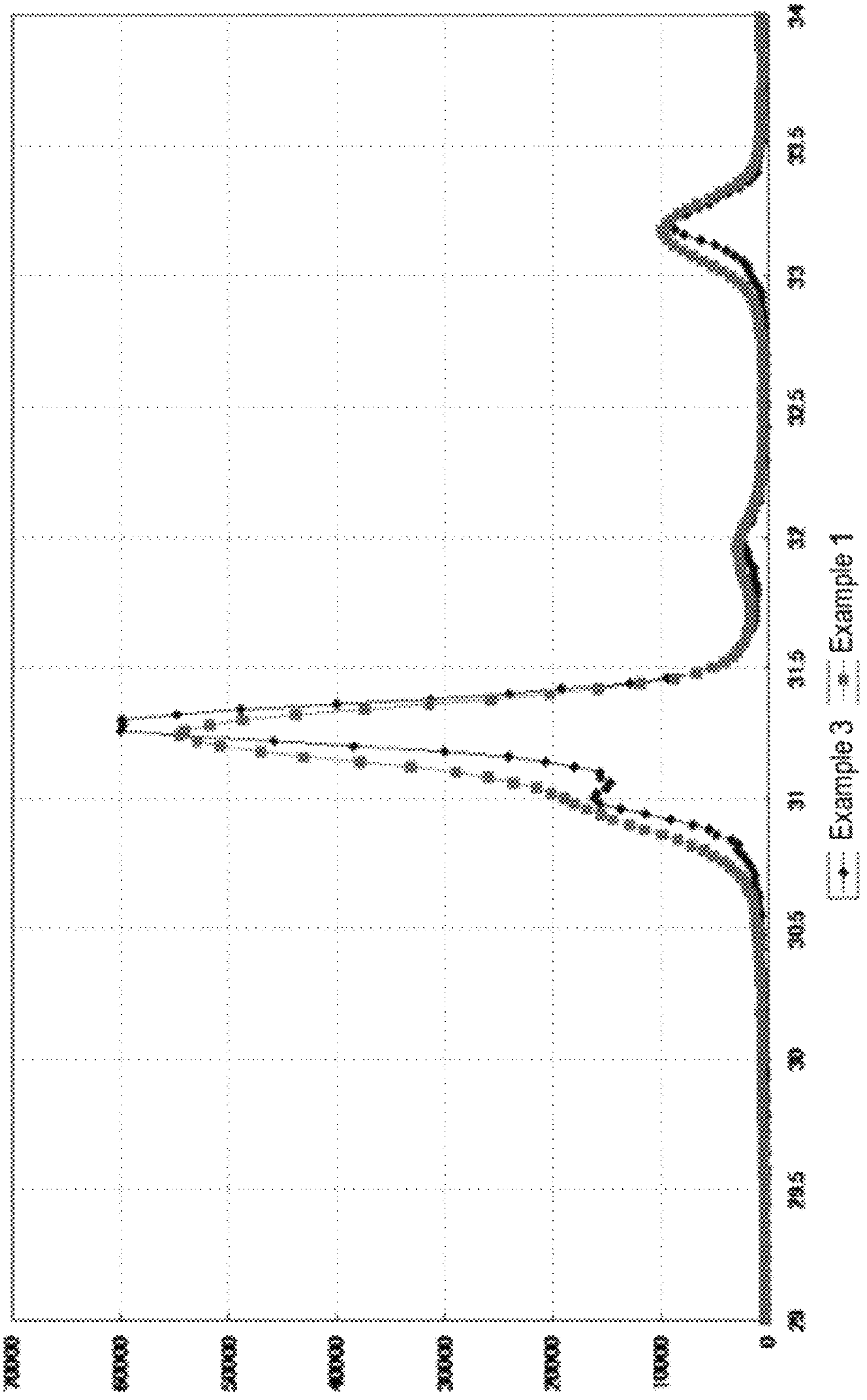
FIG. 7 is an enlarged view of an X-ray diffraction chart of the oxide sintered body prepared in Examples 1 and 3 (2θ=29° to 34°)
Figure 8:
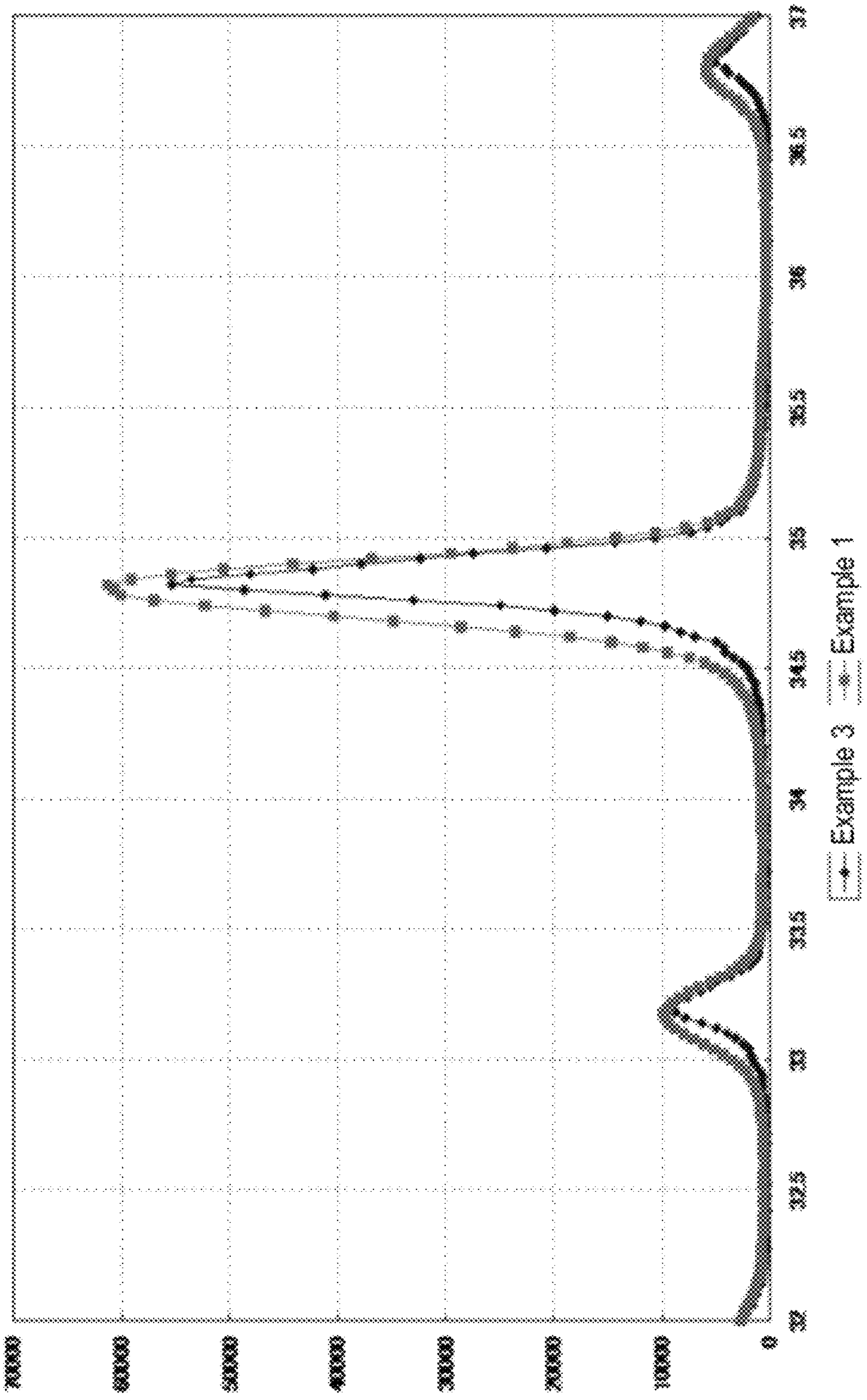
FIG. 8 is an enlarged view of an X-ray diffraction chart of the oxide sintered body prepared in Examples 1 and 3 (2θ=32° to 37°)
Figure 9:
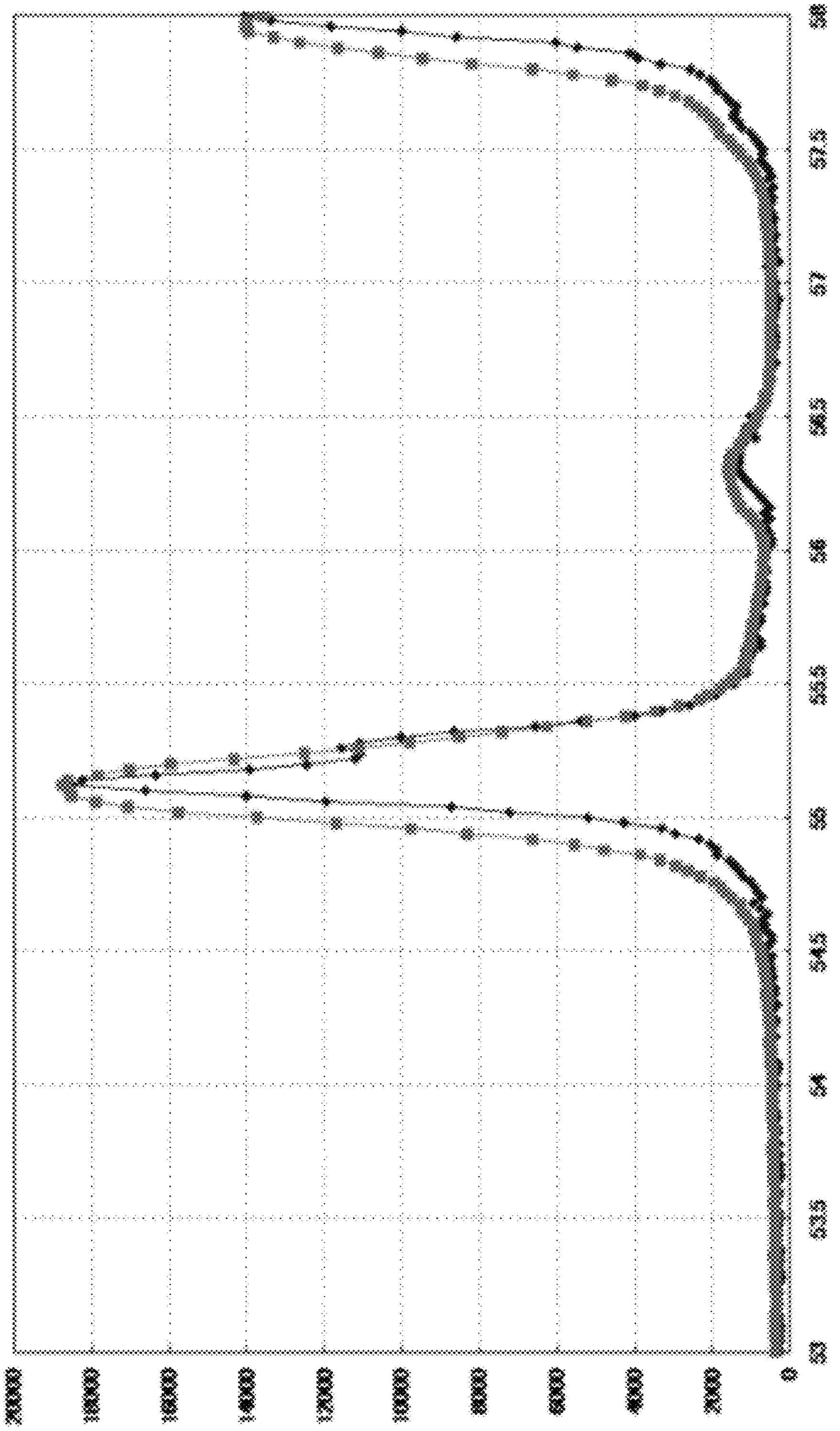
FIG. 9 is an enlarged view of an X-ray diffraction chart of the oxide sintered body prepared in Examples 1 and 3 (2θ=53° to 58°)
Figure 10:
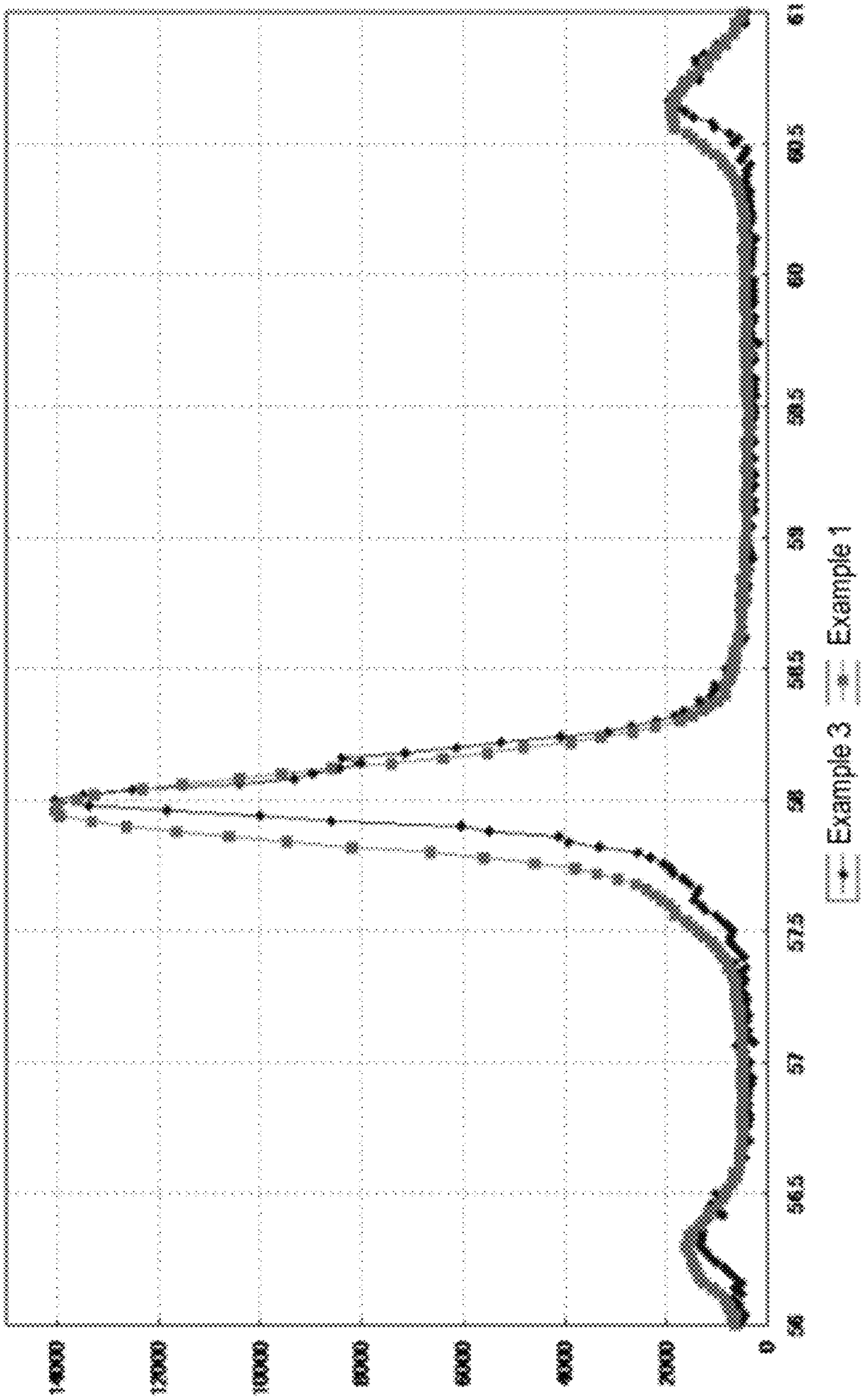
FIG. 10 is an enlarged view of an X-ray diffraction chart of the oxide sintered body prepared in Examples 1 and 3 (2θ=56° to 61°).

The oxide powder obtained as a sample from the surface of the sputtering target was subjected to an X-ray diffraction (XRD) measurement. The X-ray diffraction (XRD) chart of the target produced in Example 3 is shown in FIG. 5.

For Example 1 and 3, the peak positions of the XRD are shown in Table 2. Enlarged views of the X-ray diffraction (XRD) chart are shown in FIGS. 6 to 10.

Examples 4 to 8

Oxide sintered bodies and sputtering targets were produced and evaluated in the same manner as in Example 1, except that the composition ratios were changed to those as shown in Table 1. The results are shown in Table 1.

Comparative Example 1

Indium oxide powder (purity 4N), gallium oxide powder (purity 4N) and zinc oxide powder (purity 4N) were weighed such that the weight ratio $In_2O_3:Ga_2O_3:ZnO$ became 34:46:20, and mixed and pulverized by means of an agitator bead mill with a wet medium. As the medium for the agitator bead mill with a wet medium, zirconia beads having a diameter of 1 mm were used.

After mixing and pulverizing, the resulting mixture was dried by means of a spray dryer, and put in a mold, and subjected to press molding using a cold press machine to obtain a shaped body.

The resulting shaped body was sintered at 1200° C. for 4 hours in an oxygen atmosphere while circulating oxygen. As a result, an oxide sintered body with a relative density of 90.8% (sintered body density: 5.85 g/cm$^3$) was obtained.

As the result of X-ray diffraction, this sintered body was confirmed to be crystals of $ZnGa_2O_4$. This sintered body had a bulk resistance of 150 mΩcm.

A target (diameter: 4 inches, thickness: 5 mm) produced from this sintered body was bonded to a backing plate, and mounted in a DC sputtering film forming apparatus. In an argon atmosphere of 0.3 Pa, continuous sputtering was conducted at 100 W for 100 hours, and nodules generated on the surface were observed. As a result, generation of nodules was observed in almost half of the target surface.

The results of evaluation are shown in Table 3.

Comparative Example 2

As raw material powder, indium oxide powder with a BET specific area of 6 $m^2/g$, gallium oxide powder with a BET specific area of 6 $m^2/g$ and zinc oxide powder with a BET specific area of 3 $m^2/g$ were weighed such that the weight ratio became 45:30:25, and mixed and pulverized by means of an agitator bead mill with a wet medium. As the medium for the agitator bead mill with a wet medium, zirconia beads having a diameter of 1 mm were used.

After increasing the BET specific surface area of the pulverized powder by 2 $m^2/g$ than that of the raw material powder mixture, drying was conducted by means of a spray dryer.

The powder mixture was put in a mold and pressure-molded by means of a cold pressing machine, followed by sintering at a high temperature of 1450° C. for 8 hours in an oxygen atmosphere while circulating oxygen.

As a result, an oxide sintered body with a relative density of 92.7% (sintering density: 5.97 $g/cm^3$) was obtained without conducting prefiring. It was confirmed that this sintered body contained $InGaZnO_4$ as the main component.

This sintered body had a bulk resistance of 50 mΩcm.

The resulting sintered body was processed into a target, and an oxide semiconductor film with a film thickness of about 100 nm was formed on a glass substrate by means of an RF magnetron sputtering film-forming apparatus. In this embodiment, abnormal discharge often occurred.

The results of evaluation are shown in Table 3.

Comparative Example 3

An oxide sintered body was prepared and evaluated in the same manner as in Example 1, except that the raw material amount ratio was changed to the composition ratio shown in Table 1. The results are shown in Table 1.

The resulting oxide sintered body did not have a single crystal form as that in Example 1, and it was a sintered body in which $In_2O_3(ZnO)_3$ and $In_2O_3$ were mixed. It was confirmed that $In_2O_3(ZnO)_2$ was not generated under the conditions of Example 1 (sintering temperature: 1480° C.).

The results of evaluation are shown in Table 3.

Comparative Example 4

An oxide sintered body was formed and evaluated in the same manner as in Comparative Example 1, except that the raw material amount ratio was changed to the composition ratio shown in Table 1. The results are shown in Table 3.

Comparative Example 5

Spark plasma sintering (SPS) was conducted. By using spark plasma sintering, it is possible to obtain a sputtering target while keeping the crystal form of the shaped body. The spark plasma sintering is normally conducted by passing electric current of 100 to 1000 A/cm2 for 5 minutes to 1 hour while subjecting powder to press molding.

An oxide sintered body was formed by adjusting the composition ratio to that shown in Table 1 and passing electric current of 100 to 1000 $A/cm^2$ for 5 minutes to 1 hour to conduct spark plasma sintering (SPS) while subjecting powder to press molding. Evaluation was conducted as in Comparative Example 1. The results are shown in Table 3.

TABLE 1

| | | | Examples | | | | | | | |
|---|---|---|---|---|---|---|---|---|---|---|
| | | | 1 | 2 | 3 | 4 | 5 | 6 | 7 | 8 |
| Composition of sintered body (Atomic ratio) | In/(In + Ga + Zn) | | 0.375 | 0.375 | 0.375 | 0.360 | 0.390 | 0.380 | 0.370 | 0.370 |
| | Ga/(In + Ga + Zn) | | 0.125 | 0.125 | 0.125 | 0.135 | 0.115 | 0.130 | 0.120 | 0.130 |
| | Zn/(In + Ga + Zn) | | 0.500 | 0.500 | 0.500 | 0.500 | 0.500 | 0.490 | 0.510 | 0.500 |
| | Ga/(In + Ga) | | 0.250 | 0.250 | 0.250 | 0.273 | 0.228 | 0.255 | 0.245 | 0.260 |
| X-ray diffraction (main components) | $InGaZnO_4$(m = 1) | JCPDS card No. 38-1104 | — | — | — | — | — | — | — | — |
| | $InGaO_3(ZnO)_2$(m = 2) | JCPDS card No. 40-0252 | — | — | — | — | — | — | — | — |
| | $In_2O_3(ZnO)_2$(m = 2) | JCPDS card No. 20-1442 | — | — | — | — | — | — | — | — |
| | $In_2O_3(ZnO)_3$(m = 3) | JCPDS card No. 20-1439 | — | — | — | — | — | — | — | — |
| | $In_2O_3$ | JCPDS card No. 06-0416 | — | — | — | — | — | — | — | — |
| | $Ga_2O_3$ | JCPDS card No. 11-0370 | — | — | — | — | — | — | — | — |
| | ZnO | JCPDS card No. 36-1451 | — | — | — | — | — | — | — | — |
| | $ZnGa_2O_4$ | JCPDS card No. 38-1240 | — | — | — | — | — | — | — | — |
| | Crystal form of the invention | Not found in JCPDS card | ○ | ○ | ○ | ○ | ○ | ○ | ○ | ○ |
| Properties of targt | Relative density (%) | | 95 | 97 | 93 | 94 | 96 | 95 | 96 | 95 |
| | Bulk resistance (mΩcm) | | 4 | 2 | 6 | 5 | 3 | 4 | 3 | 4 |
| | Uniformity of resistance | | <5% | <5% | <5% | <5% | <5% | <5% | <5% | <5% |
| | Number of pinholes (number/$mm^2$) | | <10 | <10 | <10 | <10 | <10 | <10 | <10 | <10 |
| Film-forming properties of target | Abnormal discharge (number of times/ 96 hours) | | <10 | <10 | <10 | <10 | <10 | <10 | <10 | <10 |
| | Particle (number/$cm^2$) | | $\leq 10^2$ | $\leq 10^2$ | $\leq 10^2$ | $\leq 10^2$ | $\leq 10^2$ | $\leq 10^2$ | $\leq 10^2$ | $\leq 10^2$ |
| | Amount of nodules | | No | No | No | No | No | No | No | No |
| Properties of transistor | Mobility ($cm^2/Vs$) | | 23 | 23 | 22 | 23 | 23 | 23 | 23 | 23 |
| | S value (V/decade) | | 0.2 | 0.2 | 0.2 | 0.2 | 0.2 | 0.2 | 0.2 | 0.2 |

TABLE 1-continued

| | Examples 1 | 2 | 3 | 4 | 5 | 6 | 7 | 8 |
|---|---|---|---|---|---|---|---|---|
| On-off ratio | $10^{10}$ | $10^{10}$ | $10^{10}$ | $10^{10}$ | $10^{10}$ | $10^{10}$ | $10^{10}$ | $10^{10}$ |
| Moisture resistance (V) | ≤5 | ≤5 | ≤5 | ≤5 | ≤5 | ≤5 | ≤5 | ≤5 |
| Variation (V) in threshold voltage (Vth) | <1 | <1 | <1 | <1 | <1 | <1 | <1 | <1 |

"—" indicates that no XRD pattern can be confirmed.

TABLE 2

| | | Peak position 2 θ (deg) Example 1 | Example 3 |
|---|---|---|---|
| ① | A | 7.70 | 7.72 |
| ② | B | 31.24 | 31.28 |
| ③ | C | 34.80 | 34.82 |
| ④ | D | 55.10 | 55.12 |
| ⑤ | E | 57.96 | 58.00 |
| ⑥ | F | 15.46 | 15.50 |
| ⑦ | G | 23.32 | 23.34 |
| ⑧ | H | 33.18 | 33.22 |
| ⑨ | I | 44.60 | 44.62 |
| ⑩ | J | 47.66 | 47.70 |
| ⑪ | K | 64.72 | 64.76 |

TABLE 3

| | | | Com. Ex. 1 | 2 | 3 | 4 | 5 |
|---|---|---|---|---|---|---|---|
| Composition of sintered body (atomic ratio) | In/(In + Ga + Zn) | | 0.250 | 0.340 | 0.500 | 0.250 | 0.375 |
| | Ga/(In + Ga + Zn) | | 0.500 | 0.340 | 0.000 | 0.250 | 0.125 |
| | Zn/(In + Ga + Zn) | | 0.250 | 0.320 | 0.500 | 0.500 | 0.500 |
| | Ga/(In + Ga) | | 0.667 | 0.500 | 0.000 | 0.500 | 0.250 |
| X-ray diffraction (main components) | $InGaZnO_4$(m = 1) | JCPDS card No. 38-1104 | — | ○ | — | — | — |
| | $InGaO_3(ZnO)_2$(m = 2) | JCPDS card No. 40-0252 | — | — | — | ○ | — |
| | $In_2O_3(ZnO)_2$(m = 2) | JCPDS card No. 20-1442 | — | — | — | — | — |
| | $In_2O_3(ZnO)_3$(m = 3) | JCPDS card No. 20-1439 | — | — | ○ (Main component) | — | — |
| | $In_2O_3$ | JCPDScardNo. 06-0416 | — | — | ○ (Second component) | — | ○ |
| | $Ga_2O_3$ | JCPDS card No. 11-0370 | — | — | — | — | ○ |
| | ZnO | JCPDS card No. 36-1451 | — | — | — | — | ○ |
| | $ZnGa_2O_4$ | JCPDS card No. 38-1240 | ○ | — | — | — | — |
| | Crystal form of the invention | Not found in JCPDS card | — | — | — | — | — |
| Properties of target | Relative density (%) | | 91 | 93 | 92 | 89 | 72 |
| | Bulk resistance (mΩcm) | | 150 | 50 | 8 | 70 | 1800 |
| | Uniformity of resistance | | 20% | 14% | <5% | 14% | 65% |
| | Number of pinholes (number/$mm^2$) | | 30 | 20 | <10 | 20 | >100 |
| Film-forming properties of target | Abnormal discharge (number of times/96 hours) | | 35 | 20 | <10 | <10 | >100 |
| | Particle (number/$cm^2$) | | $10^4$< | ≤$10^4$ | ≤$10^2$ | ≤$10^4$ | $10^4$< |
| | Amount of nodules | | Large | No | No | No | Small |
| Properties of transistor | Mobility ($cm^2$/Vs) | | 1 | 8 | 22 | 6 | 18 |
| | S value (V/decade) | | 0.8 | 0.6 | 0.2 | 0.7 | 0.4 |
| | On-off ratio | | $10^8$ | $10^9$ | $10^{10}$ | $10^9$ | $10^9$ |
| | Moisture resistance (V) | | ≤5 | ≤5 | 5< | ≤5 | ≤5 |
| | Variation (V) in threshold voltage (Vth) | | 2 | <1 | <1 | 2 | <1 |

"—" indicates that no XRD pattern can be confirmed.

INDUSTRIAL APPLICABILITY

The oxide and the oxide sintered body of the invention can be preferably used for a sputtering target or the like which is used in forming an oxide thin film or the like. By using the oxide sintered body of the invention having properties different from those of the conventional crystal form, a thin film transistor with excellent properties can be formed uniformly and stably.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. An oxide comprising indium (In), gallium (Ga) and zinc (Zn), wherein diffraction peaks are observed at positions corresponding to incident angles (2θ) of 7.0° to 8.4°, 30.6° to 32.0°, 33.8° to 35.8°, 53.5° to 56.5° and 56.5° to 59.5° in an X-ray diffraction measurement (CuKα rays), and one of diffraction peaks observed at positions corresponding to incident angles (2θ) of 30.6° to 32.0° and 33.8° to 35.8° is a main peak and the other is a sub peak.

2. The oxide according to claim 1, wherein the atomic ratio of indium (In), gallium (Ga) and zinc (Zn) satisfies the following formulas (1) and (2):

$$0.45 \leq Zn/(In+Ga+Zn) \leq 0.60 \quad (1)$$

$$0.21 \leq Ga/(In+Ga) \leq 0.29 \quad (2).$$

3. The oxide according to claim 1, wherein all metal elements contained in the oxide consist essentially of In, Ga and Zn.

4. The oxide according to claim 1, wherein a diffraction peak is observed at an incident angle (2θ) of 14.8° to 16.2°.

5. The oxide according to claim 1, wherein diffraction peaks are observed at an incident angle (2θ) of 14.8° to 16.2° and 22.3° to 24.3°.

6. The oxide according to claim 1, wherein diffraction peaks are observed at an incident angle (2θ) of 14.8° to 16.2°, 22.3° to 24.3°, 32.2° to 34.2°, 43.1° to 46.1°, 46.2° to 49.2°, 62.7° to 66.7°.

7. An oxide sintered body which comprises the oxide according to claim 1.

8. The oxide sintered body according to claim 7, wherein the atomic ratio of indium (In), gallium (Ga) and zinc (Zn) satisfies the following formulas (1') and (2'):

$$0.15 \leq Zn/(In+Ga+Zn) \leq 0.65 \quad (1')$$

$$0.05 \leq Ga/(In+Ga) \leq 0.45 \quad (2').$$

9. A sputtering target comprising the oxide sintered body according to claim 7.

10. An oxide thin film formed by using the sputtering target according to claim 9.

11. A method for producing the sputtering target according to claim 9, comprising the following steps of:

(a) preparing a shaped body with a thickness of 5.5 mm or more;

(b) sintering the shaped body at a temperature of 1380° C. or more and 1520° C. or less for 4 to 24 hours; and (c) grinding one or both surfaces of the sintered shaped body by 0.1 mm or more.

* * * * *

UNITED STATES PATENT AND TRADEMARK OFFICE

CERTIFICATE OF CORRECTION

PATENT NO. : 8,784,699 B2
APPLICATION NO. : 13/257683
DATED : July 22, 2014
INVENTOR(S) : Koki Yano et al.

It is certified that error appears in the above-identified patent and that said Letters Patent is hereby corrected as shown below:

In the Claims

Column 22, Line 7 reads: "$0.05 \leq Ga/(In + Ga) \leq 0.45$ (2')" should read -- $0.05 < Ga/(In+Ga) < 0.45$ (2') --.

Signed and Sealed this
Eleventh Day of November, 2014

Michelle K. Lee
*Deputy Director of the United States Patent and Trademark Office*